| (12) United States Patent<br>Dodgson | (10) Patent No.: US 11,901,916 B2<br>(45) Date of Patent: Feb. 13, 2024 |
|---|---|

(54) SOFT-DECISION DECODING

(71) Applicant: Airbus Defence and Space Limited, Stevenage (GB)

(72) Inventor: Terence Dodgson, Stevenage (GB)

(73) Assignee: Airbus Defence and Space Limited, Stevenage (GB)

( * ) Notice: Subject to any disclaimer, the term of this patent is extended or adjusted under 35 U.S.C. 154(b) by 0 days.

(21) Appl. No.: 17/641,488

(22) PCT Filed: Sep. 11, 2020

(86) PCT No.: PCT/GB2020/052192
§ 371 (c)(1),
(2) Date: Mar. 9, 2022

(87) PCT Pub. No.: WO2021/048559
PCT Pub. Date: Mar. 18, 2021

(65) Prior Publication Data
US 2022/0321149 A1    Oct. 6, 2022

(30) Foreign Application Priority Data

Sep. 12, 2019   (GB) .................................... 1913178

(51) Int. Cl.
*H03M 13/39* (2006.01)
*H03M 13/11* (2006.01)
(Continued)

(52) U.S. Cl.
CPC ........ *H03M 13/3927* (2013.01); *G06N 20/00* (2019.01); *H03M 13/1111* (2013.01);
(Continued)

(58) Field of Classification Search
CPC .......... H03M 13/3927; H03M 13/1111; H03M 13/458
See application file for complete search history.

(56) References Cited

U.S. PATENT DOCUMENTS 5,548,684 A * 8/1996 Wang .................... H03M 13/41
706/34
11,522,564 B2 * 12/2022 Agrawal ............. H03M 13/616
(Continued)

FOREIGN PATENT DOCUMENTS

| CN | 109889462 A | 6/2019 |
| CN | 110166391 A | 8/2019 |

(Continued)

OTHER PUBLICATIONS

Jun Xu, Pengcheng Zhu, Jiamin Li, Xiaohu You; Deep Learning Based Pilot Design for Multi-user Distributed Massive MIMO Systems; arXiv:1903.07300v1; Mar. 18, 2019 (Year: 2019).*
(Continued)

*Primary Examiner* — Joseph D Torres
(74) *Attorney, Agent, or Firm* — Greer, Burns & Crain, Ltd.

(57) ABSTRACT

A method of soft-decision decoding including training a machine learning agent with communication signal training data; providing to the trained machine learning agent a signal that has been received via a communications channel; operating the machine learning agent to determine respective probabilities that the received signal corresponds to each of a plurality of symbols; and, based on the determined probabilities, performing soft decision decoding on the received signal.

19 Claims, 7 Drawing Sheets

(51) Int. Cl.
   *H03M 13/45* (2006.01)
   *G06N 20/00* (2019.01)
   *H03M 13/41* (2006.01)
   *H04L 1/00* (2006.01)

(52) U.S. Cl.
   CPC ...... *H03M 13/458* (2013.01); *H03M 13/3994* (2013.01); *H03M 13/4138* (2013.01); *H04L 1/005* (2013.01)

(56) References Cited

U.S. PATENT DOCUMENTS

| | | | | |
|---|---|---|---|---|
| 2004/0022301 | A1* | 2/2004 | Thron | H04B 7/0842 375/150 |
| 2007/0009057 | A1* | 1/2007 | Ito | H04L 1/0052 375/267 |
| 2018/0322388 | A1* | 11/2018 | O'Shea | G06N 3/08 |
| 2018/0343017 | A1* | 11/2018 | Kumar | G06N 3/08 |
| 2018/0358988 | A1 | 12/2018 | Sharon et al. | |
| 2020/0204299 | A1* | 6/2020 | Bennatan | H03M 13/45 |
| 2021/0142158 | A1* | 5/2021 | Agrawal | H03M 13/1111 |
| 2021/0306005 | A1* | 9/2021 | Sheiman | H03M 13/00 |

FOREIGN PATENT DOCUMENTS

| | | | | |
|---|---|---|---|---|
| WO | | 2018235050 A1 | 12/2018 | |
| WO | WO-2018235050 A1 * | | 12/2018 | ........... G06N 3/0445 |

OTHER PUBLICATIONS

O. Shental et al., ""Machine LLRning": Learning to Softly Demodulate" Cornell University Library, Jul. 2, 2019.

T. McGree et al., "Predeinterleaving Soft Decision Performance for MFSK Detection on the Rayleigh Fading Channel" Oct. 15, 1989; pp. 697-703.

K. Ouahada "Nonbinary Convolutional Codes and Modified M-FSK Detectors for Power-Line Communications Channel" Journal of Communications and Networks, vol. 16, No. 3, Jun. 1, 2014; pp. 273-274.

* cited by examiner

SOFT-DECISION DECODING

CROSS-REFERENCES TO RELATED APPLICATIONS

This application claims the benefit of the International Application No. PCT/GB2020/052192, filed on Sep. 11, 2020, and of the Great Britain patent application No. 1913178.8 filed on Sep. 12, 2019, the entire disclosures of which are incorporated herein by way of reference.

FIELD OF THE INVENTION

The present disclosure concerns soft-decision decoding. More particularly, but not exclusively, this disclosure concerns soft-decision decoding employing a machine learning agent.

BACKGROUND OF THE INVENTION

Error-correcting codes are commonly used in telecommunications systems to improve the reliability of data transmission. An error-correcting code is applied to data to generate a coded bit-stream which represents the data in a redundant manner. The redundancy allows for the coded bit-stream to be degraded and/or partially lost during transmission without resulting in loss of data. Examples of error-correcting codes include convolutional codes and trellis codes.

A coded bit-stream may be transmitted in a modulated form. In such a case, the bits of the coded bit-stream are mapped to symbols of a modulation scheme to be used in the transmission. This process may be performed by a modulator. Example modulation schemes include frequency shift keying (FSK), amplitude shift keying (ASK), and phase shift keying (PSK). A modulation scheme comprises a plurality of symbols. Each of the plurality of symbols corresponds to a set of transmissible signal characteristics, such that each symbol can be transmitted by transmitting a signal with the corresponding signal characteristics. In the case of FSK, for example, each of the symbols corresponds to a different baseband frequency, such that a symbol can be transmitted by transmitting the corresponding, complex, baseband sinusoid at that frequency. Each of the plurality of possible symbols maps onto a sequence of one or more bits (a bit group), such that each of the possible symbols represents a different possible group of bits. Thus, a coded bit-stream can be represented as a sequence of symbols. The number of bits in a bit group is determined by the number of different symbols capable of being transmitted by the modulation scheme. For example, a modulation scheme with four symbols is capable of representing four different bit groups, corresponding to a group size of two bits. A transmitter then transmits the sequence of symbols across a communications channel such that the sequence is then subsequently received at a receiver.

At the receiver, a demodulator identifies in the received signal one or more received symbols and maps the one or more received symbols onto their corresponding bit groups. The demodulator may comprise a hard-decision demodulator or a soft-decision demodulator. A hard-decision demodulator identifies which of the plurality of possible symbols the received signal corresponds to and outputs the bit group associated with that symbol. A soft-decision demodulator outputs measures of bit-certainty (soft decision values) that a received signal corresponds to each bit of a bit group. For example, a soft-decision decoder may generate for each of the plurality of possible symbols bit-probability values that the received signal corresponds to each possible bit of a symbol. Thus, a soft-decision demodulator can be considered to provide an indication of the reliability of its decisions.

It will be appreciated that the resulting sequence of soft decision values, at this stage, still represents the encoded bit-stream produced by the error-correcting code. A decoder operates to extract data from the received soft decision values. The decoder operates on the basis of knowledge of the error-correcting code applied to the data and, if a soft-decision demodulator is used, the resulting reliability information. The received soft decision values will largely correspond to the coded bit-stream, but may have been degraded during transmission. It will be appreciated that a degraded bit-stream is one which has had the value of one or more of the transmitted bits changed during transmission, for example by noise.

In general, soft-decision decoding offers improved performance compared to hard-decision decoding, as the reliability indications enable the decoder to take into account the level of certainty associated with each demodulated bit-group output. However, the improvement in performance provided by the use of soft-decision decoding is dependent on generating useful soft-decisions.

The present disclosure seeks to provide improved methods for determining soft-decisions for use in soft-decision decoding.

SUMMARY OF THE INVENTION

According to a first aspect of the present disclosure, there is provided a method of soft-decision decoding, the method comprising:
  training a machine learning agent with communication signal training data;
  providing to the trained machine learning agent a signal that has been received via a communications channel;
  operating the machine learning agent to determine respective probabilities that the received signal corresponds to each of a plurality of symbols; and
  on the basis of the determined probabilities, performing soft decision decoding on the received signal.

According to a second aspect of the present disclosure there is provided an apparatus for use in soft-decision decoding, the apparatus being configured to:
  train a machine learning agent with communication signal training data;
  provide to the trained machine learning agent a signal that has been received via a communications channel;
  operate the machine learning agent to determine respective probabilities that the received signal corresponds to each of a plurality of symbols; and
  on the basis of the determined probabilities, perform soft decision decoding on the received signal.

According to a third aspect of the present disclosure there is provided a computer program comprising a set of instructions which, when executed by a computerized device, cause the computerized device to perform a method of soft-decision decoding, the method comprising:
  training a machine learning agent with communication signal training data;
  providing to the trained machine learning agent a signal that has been received via a communications channel;
  operating the machine learning agent to determine respective probabilities that the received signal corresponds to each of a plurality of symbols; and on the basis of the determined probabilities, performing soft decision decoding on the received signal.

According to a fourth aspect of the present disclosure there is provided a system for soft-decision decoding, the system comprising:
 a receiver configured to receive a signal via a communications channel;
 a machine learning component configured to train a machine learning agent with communication signal training data, the machine learning agent being thereby configured to determine respective probabilities that the received signal corresponds to each of a plurality of symbols; and
 a soft-decision decoder configured to perform, on the basis of the determined probabilities, soft-decision decoding on the received signal.

According to a fifth aspect of the present disclosure there is provided a method of soft-decision derivation, the method comprising:
 training a machine learning agent with communication signal training data;
 providing to the trained machine learning agent a signal that has been received via a communications channel; and
 operating the machine learning agent to determine respective probabilities that the received signal corresponds to each of a plurality of symbols.

It will, of course, be appreciated that features described in relation to one aspect of the present disclosure may be incorporated into other aspects of the present disclosure. For example, the method of the disclosure may incorporate any of the features described with reference to the apparatus of the disclosure and vice versa.

BRIEF DESCRIPTION OF THE DRAWINGS

Embodiments of the present disclosure will now be described by way of example only with reference to the accompanying schematic drawings of which.

DETAILED DESCRIPTION OF THE PREFERRED EMBODIMENTS

Figure 1:
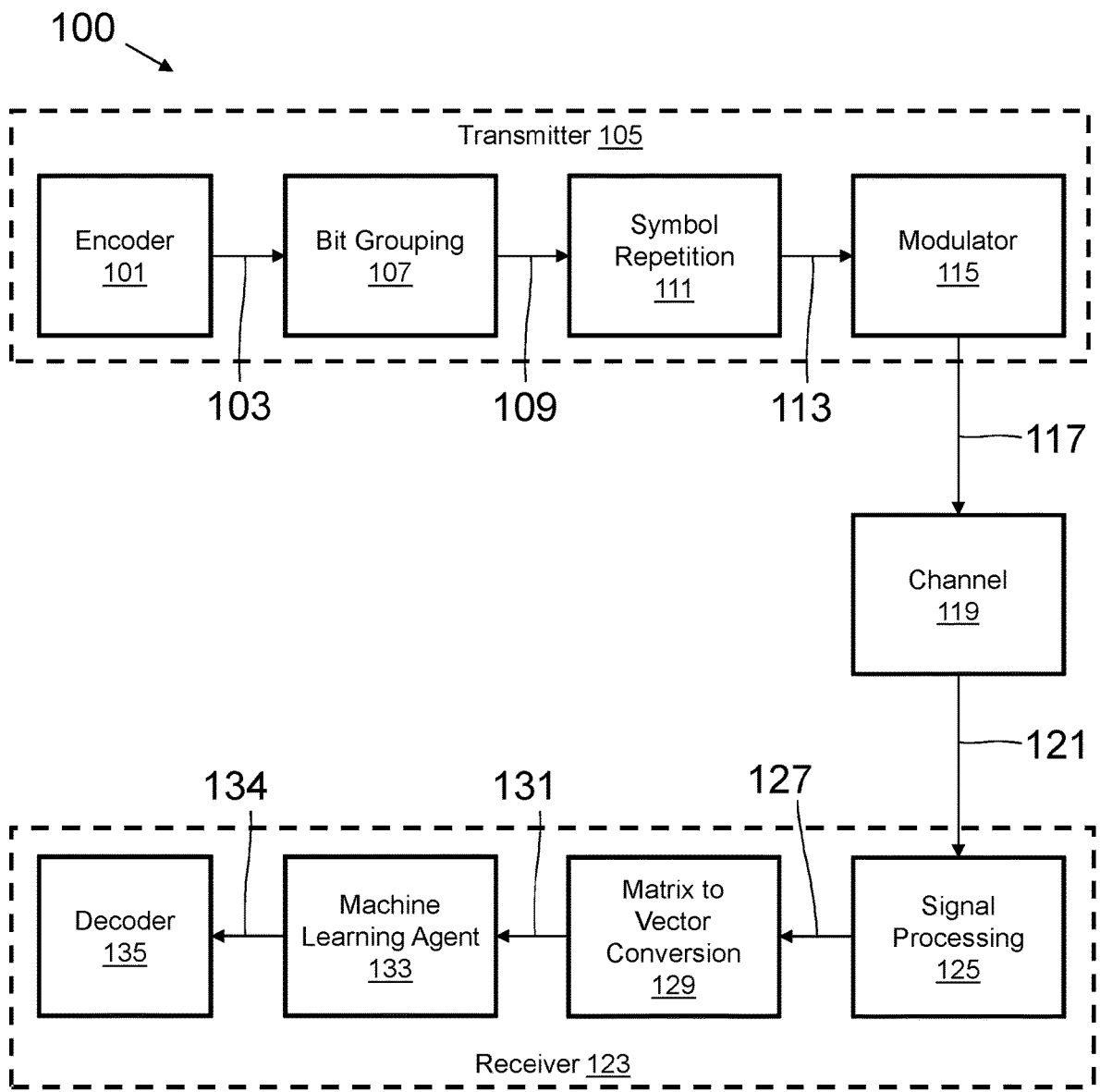
FIG. 1 shows a block diagram of a communication system according to embodiments of the present disclosure.

FIG. 1 shows a block diagram of a communication system 100 according to embodiments of the present disclosure.

System 100 comprises a transmitter 105. Transmitter 105 comprises an encoder 101 configured to receive an input data stream intended for transmission and encodes the input data stream to generate a coded bit-stream 103. In embodiments, the encoding comprises applying an error-correcting code, for example a convolutional code, to the input bit stream. It will be appreciated that, in such an embodiment, the coded bit-stream comprises the information in the input data stream but in a redundant form.

Transmitter 105 further comprises a bit-grouping component 107. Coded bit-stream 103 is received into bit grouping component 107. Bit grouping component 107 is configured to receive coded bit-stream 103 and group the individual bits of bit-stream 103 into bit-groups, the bit-groups corresponding to symbols. The number of bits in each bit group, and therefore the number of bits per symbol, is determined by the number of possible symbols. The number of possible symbols is determined by a modulation scheme to be applied by transmitter 105. For example, four-level multiple frequency shift keying is capable of transmitting four distinct symbols. Therefore, four distinct bit groups can be represented, which corresponds to groups that are two bits long. The output of bit grouping component 107 is a symbol sequence 109 corresponding to coded bit-stream 103. In embodiments, each symbol corresponds to a single bit-group.

In embodiments, transmitter 105 further comprises symbol repetition component 111. Symbol repetition component 111 is configured to receive symbol sequence 109 and to repeat each of the symbols of the sequence to generate a repeated symbol sequence 113. For example, symbol repetition component 111 may repeat each symbol of symbol sequence 109 three times. In embodiments, symbols are repeated sequentially, such that repetitions of a given symbol are grouped together in repeated symbol sequence 113. In embodiments, symbols are repeated with time diversity, such that symbol repetitions are spread throughout repeated symbol sequence 113. For example, repeated symbol sequence 113 may comprise repetitions of symbol sequence 109 as a whole, such that each repetition of a symbol is spaced apart by the length of symbol sequence 109. In embodiments, symbols are repeated with frequency diversity, such that symbol repetitions are transmitted on different carrier frequencies. It will be appreciated by the skilled person that symbol repetition component 111 is an optional element of transmitter 105, intended to improve transmission reliability. Alternative embodiments of the present disclosure do not incorporate any symbol repetition.

Transmitter 105 further comprises a modulator 115. Modulator 115 is configured to receive repeated symbol sequence 113 and, on the basis of repeated symbol sequence 113, generate a modulated signal 117 for transmission. Generating the modulated signal may comprise modulating a carrier signal with a baseband signal. Thus, generating the modulated signal may comprise applying a modulation scheme to a baseband signal. The skilled person will appreciate that the modulation scheme of modulator 115 can also be said to be a modulation scheme of transmitter 105. A number of states of the modulated signal correspond to the number of possible symbols, such that each of the possible symbols corresponds to a particular state of the modulated signal. Thus, a symbol can be transmitted by putting modulated signal 117 into the state corresponding to that symbol. Modulated signal 117 can therefore be said to comprise a plurality of symbols, the symbols being represented by states of modulated signal 117. It will be appreciated that it is this modulation scheme which determines the number of possible symbols and thereby the number of bits per symbol. In embodiments, the modulation scheme comprises multiple frequency shift keying (MFSK). However, the skilled person will appreciate that other modulation schemes (for example, amplitude shift keying (ASK), quadrature amplitude modulation (QAM), minimum shift keying (MSK), or phase shift keying (PSK)) can also be used.

Thus, transmitter 105 is configured to convert an input data stream into a form suitable for transmission. Transmitter 105 is configured to transmit modulated signal 117 across a communications channel 119. In embodiments, channel 119 comprises a wireless signal transmission path and modulator 115 comprises an antenna. Channel 119 may comprise a lossy channel. The transmission of modulated signal 117 via channel 119 may therefore result in a degradation of the signal, such that a received signal 121 at the output of channel 119 is degraded. The skilled person will appreciate that a degraded signal is one which has been distorted during transmission, such that, for one or more symbols of received signal 121, either it is unclear what symbol was originally transmitted or the received symbol appears to be a different symbol to that which was transmitted.

Received signal 121 is received by a receiver 123. Receiver 123 may be configured to receive received signal 121 via an antenna, for example in cases where channel 119 comprises a wireless signal transmission path.

Receiver 123 comprises signal processing component 125. In embodiments, signal processing component 125 is configured to determine one or more signal characteristics for each of the plurality of symbols. It will be appreciated that, for each of the plurality of possible symbols, bounds exist on characteristics of a signal within which the signal is considered to correspond to a given symbol and outside of which the signal is considered not to correspond to that given symbol. These bounds can be considered to define a bin for each of the plurality of possible symbols, such that each of the plurality of possible symbols is associated with an individual bin. Thus, received signal 121 can be identified as corresponding to a particular one of the plurality of possible symbols on the basis of whether, or to what extent, it falls within each of the bins.

In embodiments, the one or more signal characteristics comprise received power values for each of the plurality of symbols. In embodiments, signal processing component 125 is configured to perform a Fourier transform on received signal 121 to determine the received power values. It will be appreciated that performing a Fourier transform on received signal 121 provides an indication of the frequency distribution of received power. Where the modulation scheme in use allows for a symbol to be identified by its frequency content (for example, MFSK), the frequency distribution of received signal 121 power can provide an indication of which of the plurality of symbols has been received. In embodiments, signal processing component 125 is configured to normalize the received power values relative to a maximal one of the received power values. Therefore, in such embodiments, each of the plurality of bins may contain an indication of the received power associated with the corresponding symbol. In embodiments, the one or more signal characteristics comprise correlation values for each of the plurality of symbols. In such embodiments, each of the plurality of bins may contain an indication of a correlation between the corresponding symbol and received signal 121.

The skilled person will appreciate that the plurality of bins can be considered to comprise a vector, such that a vector is generated for each symbol of received signal 121. Therefore, in embodiments, signal processing component 125 is configured to generate and output a vector for each received symbol. In embodiments performing symbol repetition, a plurality of vectors are generated for each symbol. The plurality of vectors comprise a matrix 127. Thus, in such embodiments, the output of signal processing component 125 is matrix 127. It will be appreciated that the number of vectors per symbol, and thereby the depth of the resulting matrix is determined by the number of symbol repetitions.

In embodiments, receiver 123 comprises a matrix to vector conversion component 123. Matrix to vector conversion component 129 is configured to receive matrix 127 and to convert it into a vector 131, for example a column vector. It will be appreciated by the skilled person that vector 131 need not necessarily be a column vector, so long as the resulting data is in a one dimensional form. It will also be appreciated that matrix to vector conversion component 129 is an optional element, and that embodiments not performing symbol repetition do not generate matrix 127 so do not need to perform any conversion.

Figure 2:
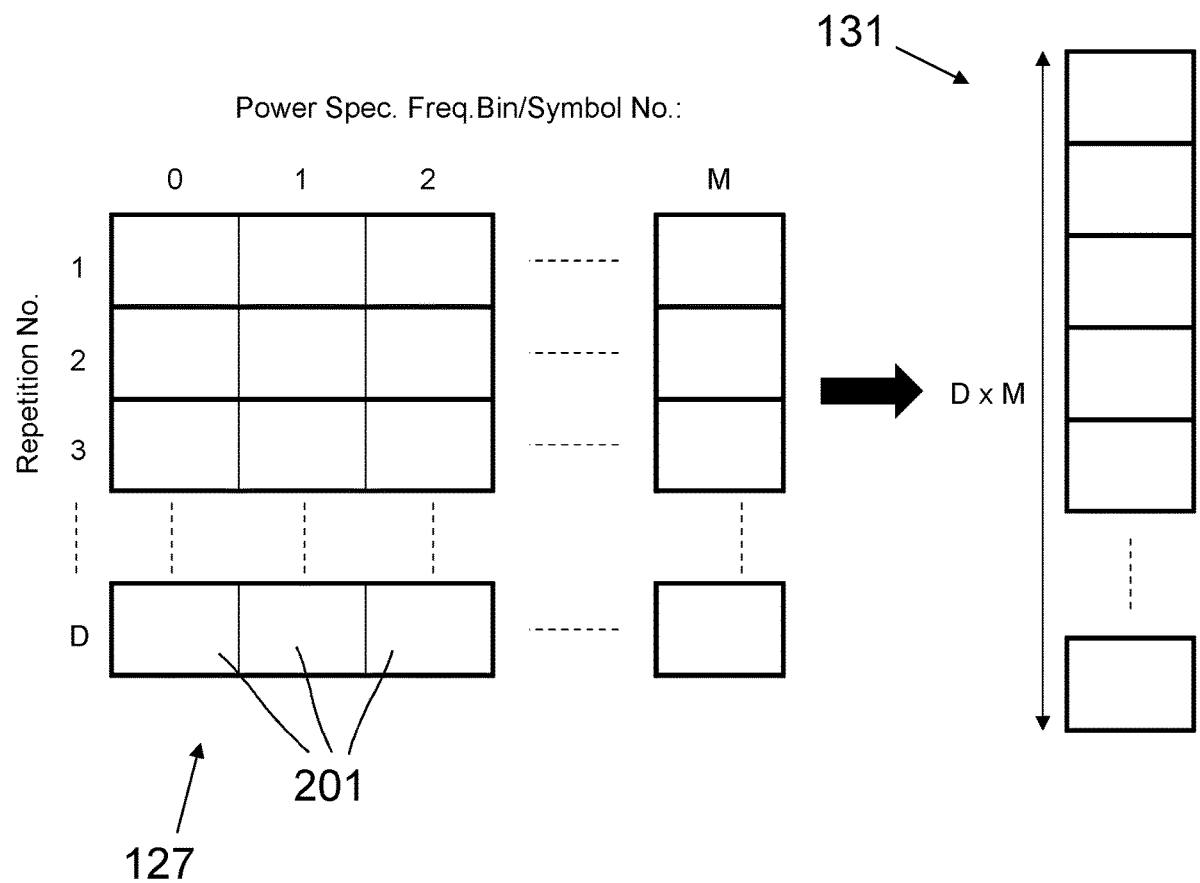
FIG. 2 shows a diagram illustrating the matrix to vector conversion of FIG. 1 according to embodiments of the present disclosure.

FIG. 2 shows a diagram illustrating operation of matrix to vector conversion component 129. Matrix 127 comprises a plurality of vectors, each vector comprising M bins 201. In this case, matrix 127 comprises D vectors, corresponding to a symbol repetition rate of D. Hence, matrix 127 comprises a two dimensional M×D matrix. Matrix to vector conversion component 129 operates to convert matrix 127 into a single vector 131. Vector 131 therefore comprises M×D elements. There is no requirement for any specific ordering of the elements of vector 131. Vector 131 may be formed by concatenation of the columns of matrix 127, such that bins corresponding to a given symbol are grouped in vector 131. Alternatively, vector 131 may be formed by concatenation of the rows of matrix 127, such that bins are grouped in vector 131 by their corresponding repetition.

Returning to FIG. 1, in embodiments, receiver 123 comprises a machine learning agent 133. Receiver 123 is configured to provide vector 131 to machine learning agent 133. Thus, machine learning agent 133 can be said to be provided with a signal that has been received via channel 119. Machine learning agent 133 receives vector 131 as an input and therefore, in embodiments, operates on the basis of the determined signal characteristics.

Machine learning agent 133 is configured to determine respective probabilities that received signal 121 corresponds to each of the plurality of possible symbols. In embodiments, machine learning agent 133 determines the respective probabilities on the basis of a power spectrum of the received signal. In embodiments, machine learning agent 133 determines the respective probabilities on the basis of correlation values that the received signal corresponds to each of a plurality of possible symbols. Thus, the output of machine learning agent 133 is a plurality of probabilities 134. In embodiments, machine learning agent 133 is configured to determine respective bit-probabilities that each bit of the received symbol bit-group corresponds to either a '1' or a '0'. Thus, in embodiments, machine learning agent 133 is configured to determine respective bit-probabilities, the bit-probabilities defining a likelihood that received signal 121 corresponds to each of the plurality of possible symbols. It will therefore be appreciated by the skilled person that a probability that a received signal corresponds to a symbol may comprise a plurality of bit-probabilities that the received signal corresponds to each possible value of the bits in the bit-group corresponding to that symbol. Machine learning agent 133 comprises a plurality of weights and biases, the values of which determine the behavior of machine learning agent 133. The values of the plurality of weights and biases are selected by a training process, details of and a system for performing which are described below. In embodiments, machine learning agent 133 is configured to determine a normalized probability pair for each of the bits comprising a symbol. In embodiments, a normalized probability pair comprises a first probability that a respective symbol bit is a zero and a second probability that the respective symbol bit is a one.

Figure 3:
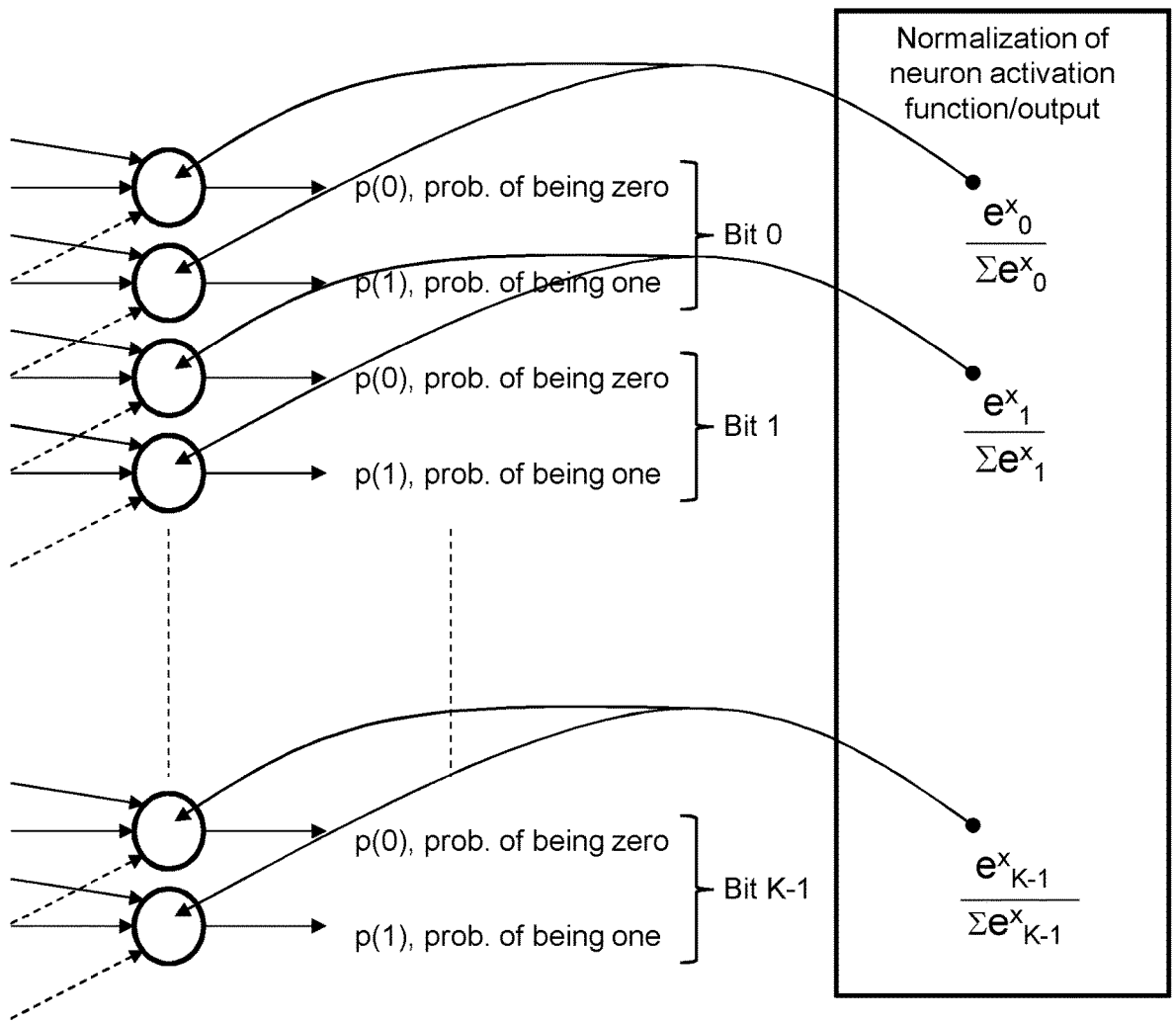
FIG. 3 shows a diagram illustrating the output of the machine learning agent of FIG. 1 according to embodiments of the present disclosure.

FIG. 3 shows a diagram illustrating example outputs of machine learning agent 133. Machine learning agent 133 is, in this example, configured to generate a normalized probability pair for each symbol bit. Thus, two probabilities are generated for each symbol bit. It will be appreciated by the skilled person that the two probabilities comprising each normalized probability pair sum to 1.

In embodiments, machine learning agent 133 comprises an artificial neural network, for example a deep learning neural network. In embodiments, output neurons of the artificial neural network employ a softmax activation function. In embodiments, hidden neurons of the artificial neural network employ a rectified linear unit activation function.

Returning to FIG. 1, receiver 123 comprises a decoder 135. Decoder 135 is configured to receive determined probabilities 134 and, on the basis of determined probabilities 134, perform soft decision decoding of received signal 121. In embodiments, performing soft decision decoding comprises determining a symbol or sequence of symbols most likely to correspond to received signal 121. In embodiments, performing soft decision decoding comprises performing forward error correction decoding on received signal 121. Soft decision decoding techniques are known in the art and will not be discussed in detail here. The output of decoder 135 is a decoded data stream.

In embodiments, received signal 121 comprises a frequency shift keying modulated signal. It will be appreciated by the skilled person that system 100 may be particularly useful for this modulation scheme due to the indirect link between the received signal and the associated bit-stream.

Figure 4:
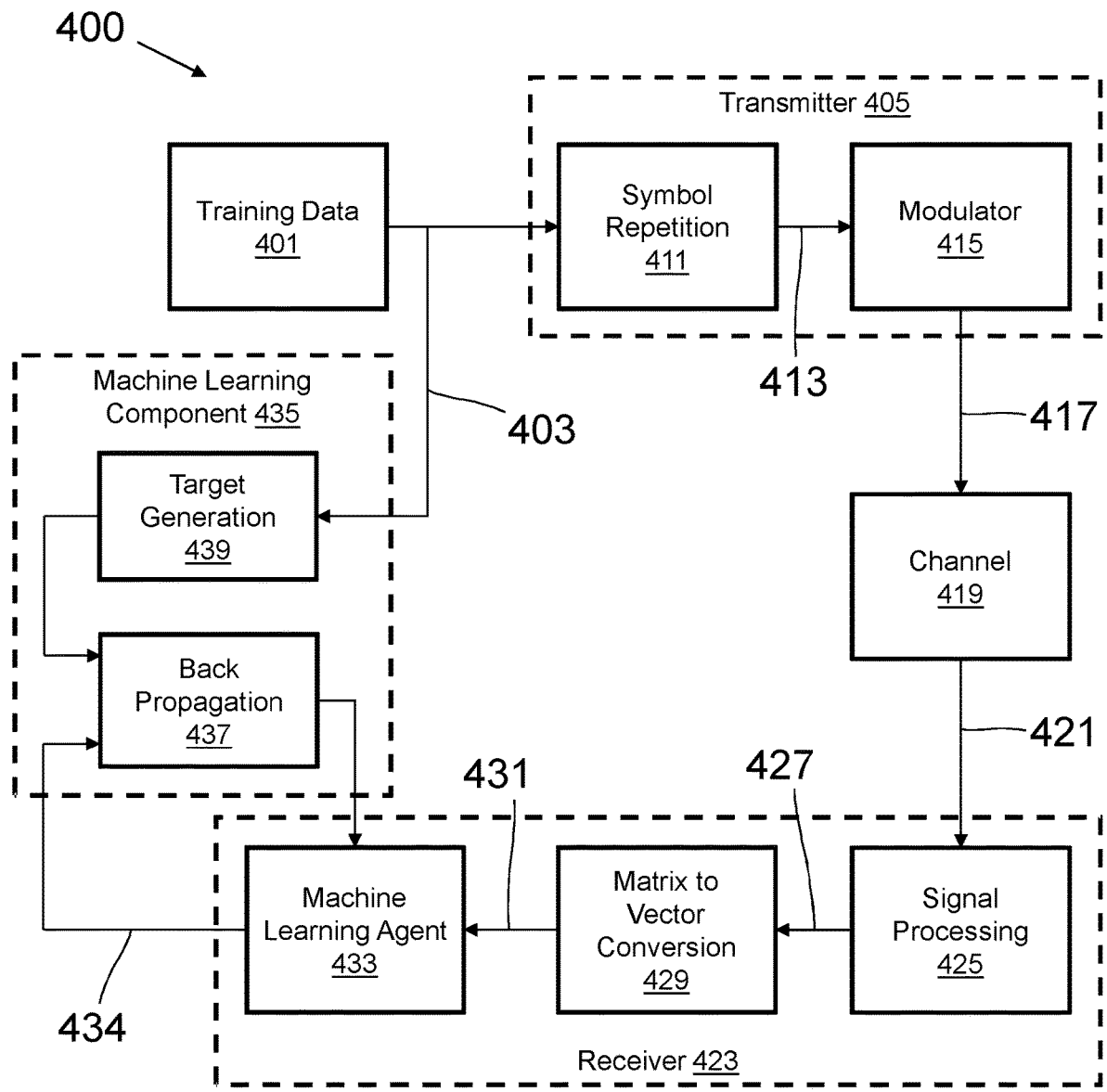
FIG. 4 shows a training system according to embodiments of the present disclosure.

FIG. 4 shows a training system 400 according to embodiments of the present disclosure. Training system 400 replicates system 100 apart from encoder 101, bit grouping component 107, and decoder 135. In the place of encoder 101 and bit grouping component 107, training system 400 comprises training data component 401. Training data component 401 generates a plurality of symbols for use in training machine learning agent 433 to generate soft-decisions for use in soft-decision decoding. Training data component 401 can therefore be said to generate communication signal training data.

In embodiments, training data component 401 is configured to generate one or more symbols, for example at random, from the plurality of possible symbols. The generated one or more signals comprise a training signal 403, which is passed to transmitter 405. In embodiments, training data generated by training data component 401 comprises one or more pilot signals. In embodiments, training data generated by training data component 401 comprises one or more previously transmitted communications signals. In embodiments, the previously transmitted communications signals were transmitted via channel 419. Embodiments in which training data generated by training data component 401 comprises communications signals previously transmitted via channel 419 can enable machine learning agent 433 to be trained specifically for use with channel 419. In such embodiments, trained machine learning agent 433 may be particularly well adapted to channel 419.

Training data generated by training data component 401 is provided to transmitter 405, which operates as described in respect of system 100, generating a modulated signal 417 for transmission over a channel 419. It will be appreciated that channel 419 need not necessarily be a real communications channel, and could be simulated. Simulating a communications channel may comprise applying simulated noise or interference to modulated signal 417. Thus, in embodiments, channel 419 is configured to apply a noise function to the generated symbols. Applying a noise function to the generated symbols allows machine learning agent 433 to train to operate in the presence of noise. In embodiments, a magnitude of the noise function is varied across training data generated by training data component 401, for example between each symbol generated by training data component 401. Varying a magnitude of the applied noise function trains machine learning agent 433 to operate in the presence of noise of varying magnitude. In embodiments, the magnitude of the applied noise function is varied so as to vary the signal to noise ratio between 0 dB and 9 dB. It will be appreciated that a suitable range of noise magnitude for a given implementation will be determined at least in part by the choice of modulation scheme, symbol repetition rate, and the required bit error rate. It will also be appreciated that the required bit error rate depends on the given application and the type of data being transmitted.

Receiver 423 and machine learning agent 433 operate as previously described in respect of system 100 with corresponding elements having similar numbering albeit with a difference of 300 between them. However, in the place of decoder 135, training system 400 comprises a machine learning component 435. A plurality of probabilities 434 generated by machine learning agent 433 are provided to machine learning component 435, along with training signal 403.

Machine learning component 435 comprises back propagation component 437 and target generation component 439. Target generation component 439 is configured to receive training signal 403 and, on the basis of training signal 403, generate a target plurality of probabilities. Thus, target generation may be configured to map the symbols from training data 401 onto a plurality of probabilities.

Back propagation component 437 is configured to determine, on the basis of plurality of probabilities 434 and the target probabilities, an updated set of weights and biases for machine learning agent 433. Thus, machine learning component 435 can be considered to evaluate the generated plurality of probabilities and, on the basis of the evaluation, determine updated weights and/or biases for machine learning agent 433. By iterating the process of feeding a training signal through the system, evaluating the generated probabilities, and generating updated weights, machine learning agent 433 can be trained to determine soft decisions for soft-decision decoding. Training system 400 can therefore be said to be configured to train machine learning agent 433 to generate soft-decisions for use in soft-decision decoding. In embodiments, the updated plurality of weights and biases are determined by performing a stochastic gradient descent with Adams optimization. For example, Adams optimization may be performed following each iteration of the stochastic gradient descent. Thus, in embodiments, machine learning component 435 is configured to perform a stochastic gradient descent to obtain a plurality of weights and biases for machine learning agent 433. In embodiments, machine learning agent 433 is trained until a convergence criterion is met. The convergence criteria may comprise a maximum number of iterations. The convergence criteria may comprise a threshold, for example a minimum, for the change in values of the weights and/or biases between a pre-determined number of iterations.

Once training of machine learning agent 433 has been carried out, machine learning agent 433 can be deployed to a live system, for example system 100. It will be appreciated that the act of deploying machine learning agent 433 may comprise copying the determined weights and biases to an existing machine learning agent in a communication system.

Figure 5:
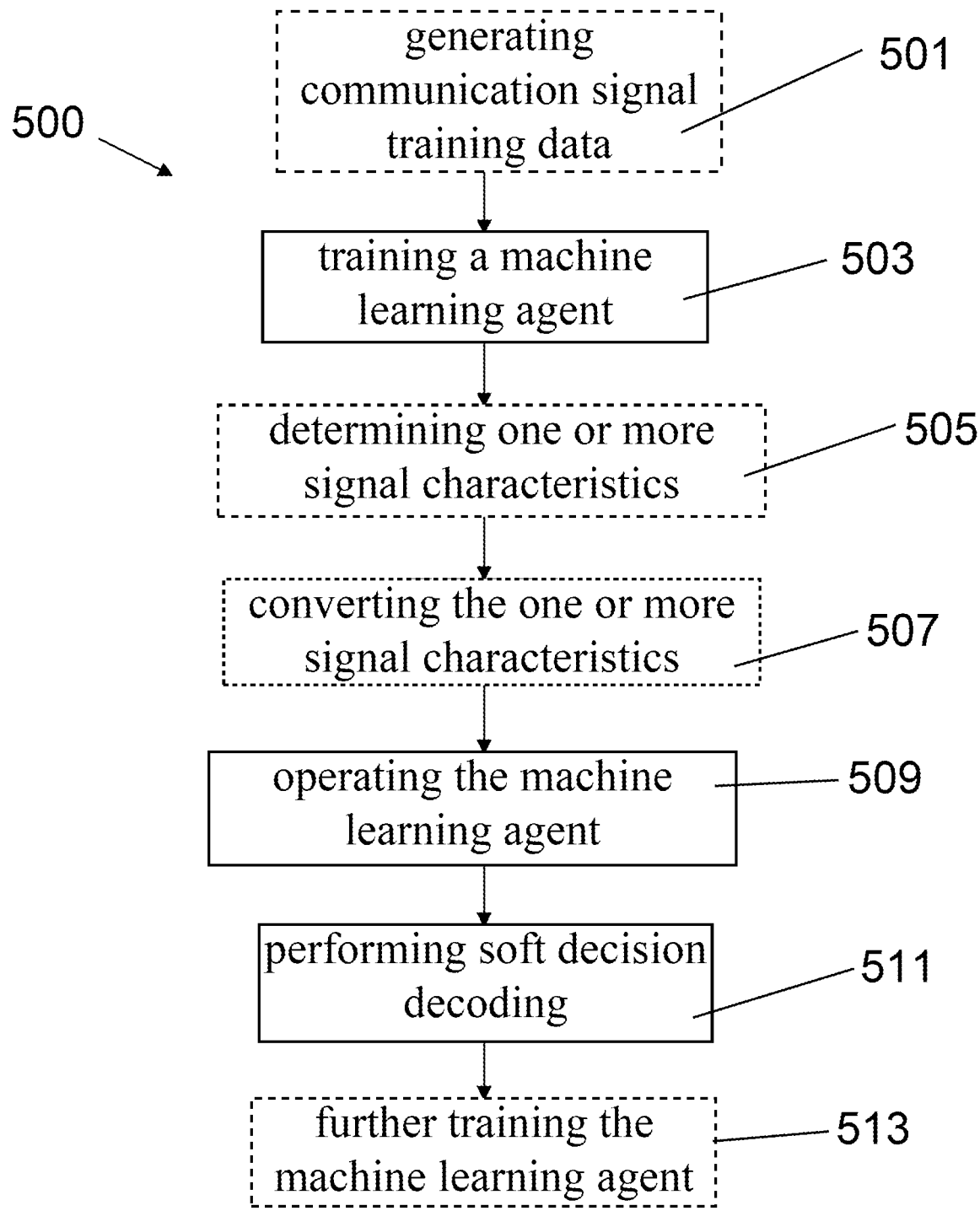
FIG. 5 shows a flow chart illustrating the steps of a method according to embodiments of the present disclosure.

FIG. 5 shows a flow chart illustrating the steps of a method 500 of soft-decision decoding according to embodiments of the present disclosure.

An optional first step, represented by item 501, of method 500 comprises generating communication signal training data by applying a noise function to a set of known symbols. In embodiments, a magnitude of the applied noise function is varied across the training data. In embodiments, a magnitude of the applied noise function is varied between each symbol of the training data. In embodiments, varying the magnitude of the applied noise function comprises varying the signal to noise ratio between 0 dB and 9 dB. In embodiments, the training data comprises one or more pilot signals. In embodiments, the training data comprises one or more previously transmitted communications signals. In embodiments, the previously transmitted communications signals were transmitted via a communications channel.

A second step, represented by item 503, of method 500 comprises training a machine learning agent with the communication signal training data. In embodiments, the training comprises performing a stochastic gradient descent to obtain a plurality of weights and biases for the machine learning agent. In embodiments, Adams optimization is performed after each iteration of the stochastic gradient descent. In embodiments, the machine learning agent comprises an artificial neural network. In embodiments, output neurons of the artificial neural network employ softmax activation functions. In embodiments, hidden neurons of the artificial neural network employ rectified linear unit activation functions.

An optional third step, represented by item 505, of method 500 comprises determining one or more signal characteristics for each of the plurality of symbols. In embodiments, the signal characteristics are determined from a received signal. In embodiments, the received signal has been received via a communications channel, for example the same the communications channel as used in the training. In embodiments, the received signal comprises a frequency shift keying modulated signal. In embodiments, the one or more signal characteristics comprise received power values for each of the plurality of symbols. In embodiments, determining the one or more signal characteristics comprises performing a Fourier transform on the received signal to determine the received power values. In embodiments, the one or more signal characteristics comprise correlation values for each of the plurality of symbols. In embodiments the one or more signal characteristics comprise combined power and correlation values.

An optional fourth step, represented by item 507, of method 500 comprises converting the one or more signal characteristics into a vector and providing the vector to the machine learning agent as an input. Thus, the trained machine learning agent is provided with a signal that has been received via a communications channel.

A fifth step, represented by item 509, of method 500 comprises operating the machine learning agent to determine respective probabilities that the received signal corresponds to each of a plurality of symbols. In embodiments, operating the machine learning agent comprises determining a normalized probability pair for each symbol bit. In embodiments, a normalized probability pair comprises a first probability that a respective symbol bit is a zero and a second probability that the respective symbol bit is a one. In embodiments, the operating is carried out on the basis of the determined signal characteristics.

The skilled person will appreciate that the second and fifth steps (and optionally also the first, third, and fourth steps) together constitute a method of soft-decision derivation. The skilled person will understand that soft-decision derivation refers to a process of determining, for each of a plurality of possible symbols, a probability that a received signal corresponds to that symbol.

A sixth step, represented by item 511, of method 500 comprises, on the basis of the determined probabilities, performing soft decision decoding on the received signal.

An optional seventh step, represented by item 513, of method 500 comprises, subsequent to the performing, further training the machine learning agent with further communication signal training data. In embodiments, the further communication signal training data comprises one or more pilot signals. In embodiments, the further training is performed periodically.

Figure 6:
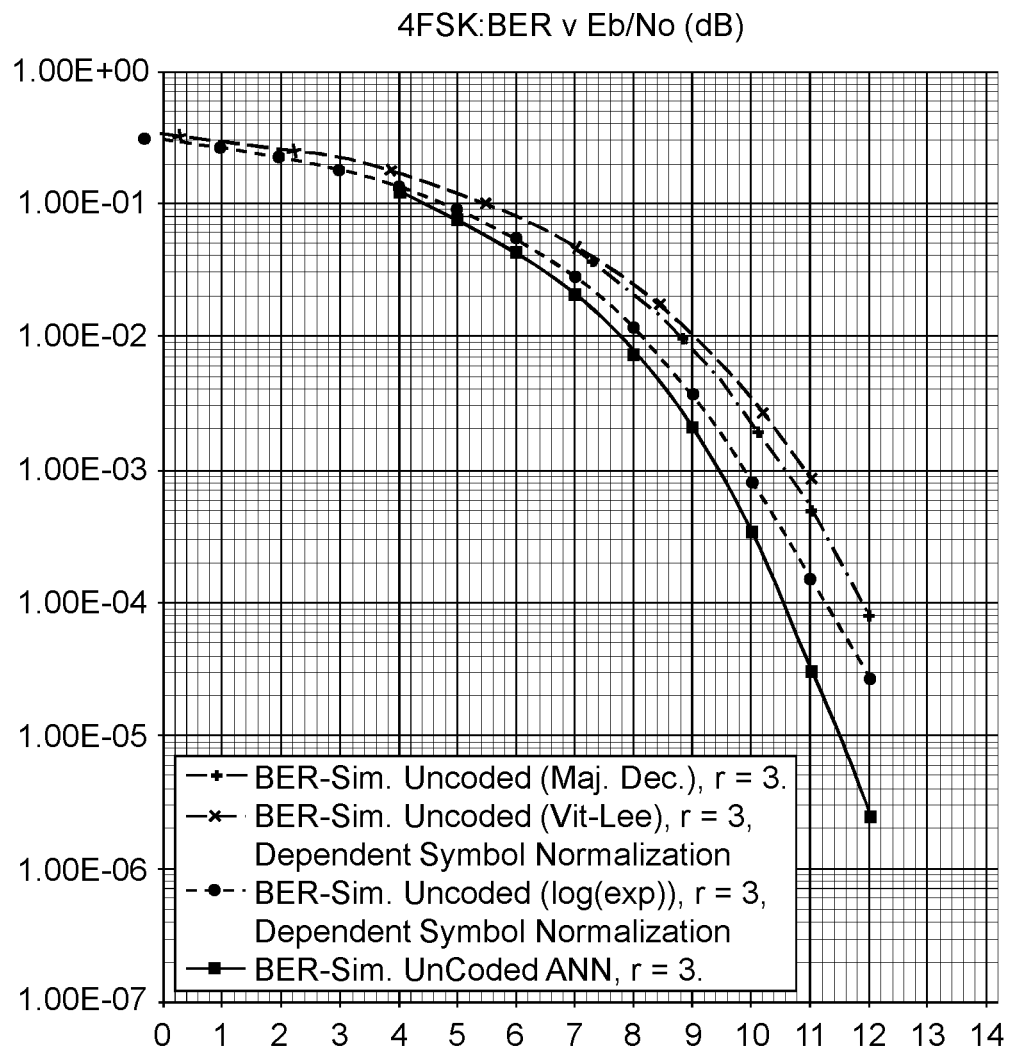
FIGS. 6 and 7 show graphs illustrating the performance of a system according to embodiments to the present disclosure.
Figure 7:
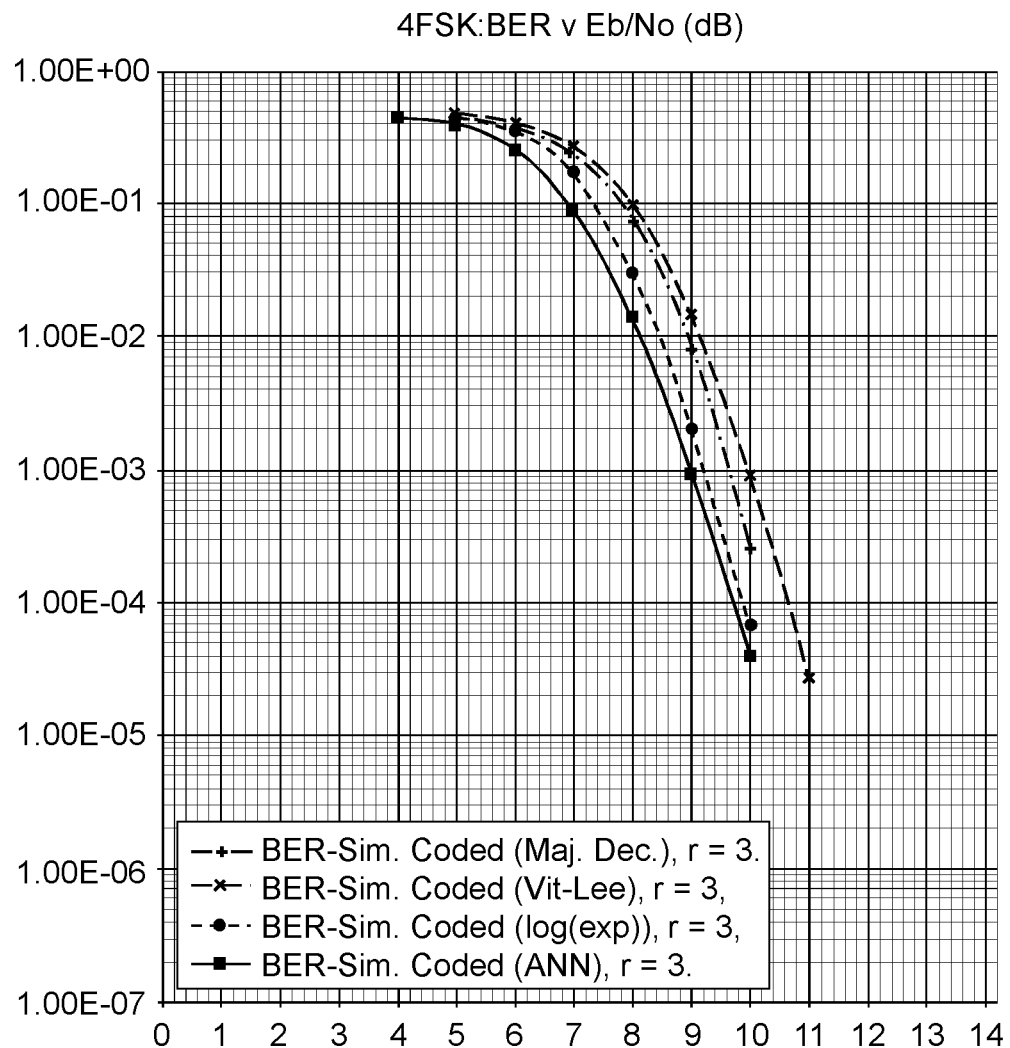

FIGS. 6 and 7 shows graphs illustrating the performance of a system according to embodiments to the present disclosure. As can be seen in each of the Figures, the system of the present invention offers improved performance compared to prior art systems.

Embodiments comprise a computer program comprising a set of instructions which, when executed by a computerized device, cause the computerized device to perform a method of soft-decision decoding, the method comprising:
  training 503 a machine learning agent with communication signal training data;
  providing to the trained machine learning agent a signal that has been received via a communications channel;
  operating 509 the machine learning agent to determine respective probabilities that the received signal corresponds to each of a plurality of symbols; and
  on the basis of the determined probabilities, performing 511 soft decision decoding on the received signal.

Embodiments comprise a system for soft-decision decoding, the system comprising:
  a receiver 123 configured to receive a signal via a communications channel;
  a machine learning component 435 configured to train a machine learning agent 433 with communication signal training data, the machine learning agent being thereby configured to determine respective probabilities that the received signal corresponds to each of a plurality of symbols; and
  a soft-decision decoder 135 configured to perform, on the basis of the determined probabilities, soft-decision decoding on the received signal.

Embodiments also provide measures for use in soft-decision derivation. A machine learning agent is trained with communication signal training data. The trained machine learning agent is provided with a signal that has been received via a communications channel. The machine learning agent is operated to determine respective probabilities that the received signal corresponds to each of a plurality of symbols.

Soft-decision derivation as described herein refers to a process of determining an indication of the reliability of a demodulation decision (for example, from demodulation of a received signal). Thus, a method of soft-decision derivation may comprise calculating measures of bit-certainty (i.e., soft decisions) that a received signal corresponds to each bit of a bit group.

While the present disclosure has been described and illustrated with reference to particular embodiments, it will be appreciated by those of ordinary skill in the art that the disclosure lends itself to many different variations not specifically illustrated herein. By way of example only, certain possible variations will now be described.

In embodiments of the present disclosure, communication system 100 comprises the training components of training system 400. Thus, in embodiments, system 100 comprises a machine learning component, including target generation and back propagation.

Embodiments are configured to further train machine learning agent 133 with further communication signal training data. In embodiments, the further communication signal training data comprises one or more pilot signals. Once deployed, further training machine learning agent 133 may allow machine learning agent to specialize to a specific communications channel. In such a case, the specialized machine learning agent may offer improved performance compared to a generalized machine learning agent. Thus, in embodiments, transmitter 105 is configured to transmit a pilot signal. It will be appreciated that a pilot signal is one which has known characteristics. Thus, the machine learning component can generate a target plurality of probabilities for use in back propagation on the basis of the known characteristics of the pilot signal.

In embodiments, the further training is performed periodically. In some such embodiments, transmitter 105 is configured to transmit a pilot signal periodically. Periodic training of the machine learning agent allows continued improvement in the performance of machine learning agent once deployed. Periodic training may further allow the machine learning agent to adapt to dynamic changes in characteristics of the communications channel.

Systems 100 and 400 may comprise one or more processors and/or memory. Each device, module, component, machine or function as described in relation to any of the examples described herein, for example transmitter 105, receiver 123, or machine learning component 435 may similarly comprise a processor or may be comprised in apparatus comprising a processor. One or more aspects of the embodiments described herein comprise processes performed by apparatus. In some examples, the apparatus comprises one or more processors configured to carry out these processes. In this regard, embodiments may be implemented at least in part by computer software stored in (non-transitory) memory and executable by the processor, or by hardware, or by a combination of tangibly stored software and hardware (and tangibly stored firmware). Embodiments also extend to computer programs, particularly computer programs on or in a carrier, adapted for putting the above-described embodiments into practice. The program may be in the form of non-transitory source code, object code, or in any other non-transitory form suitable for use in the implementation of processes according to embodiments. The carrier may be any entity or device capable of carrying the program, such as a RAM, a ROM, or an optical memory device, etc.

The one or more processors of systems 100 and 400 may comprise a central processing unit (CPU). The one or more processors may comprise a graphics processing unit (GPU). The one or more processors may comprise one or more of a field programmable gate array (FPGA), a programmable logic device (PLD), or a complex programmable logic device (CPLD). The one or more processors may comprise an application specific integrated circuit (ASIC). It will be appreciated by the skilled person that many other types of devices, in addition to the examples provided, may be used to provide the one or more processors. The one or more processors may comprise multiple co-located processors or multiple disparately located processors. Operations performed by the one or more processors may be carried out by one or more of hardware, firmware, and software.

The one or more processors may comprise data storage. The data storage may comprise one or both of volatile and non-volatile memory. The data storage may comprise one or more of random access memory (RAM), read-only memory (ROM), a magnetic or optical disk and disk drive, or a solid-state drive (SSD). It will be appreciated by the skilled person that many other types of memory, in addition to the examples provided, may also be used. It will be appreciated by a person skilled in the art that the one or more processors may each comprise more, fewer and/or different components from those described.

The techniques described herein may be implemented in software or hardware, or may be implemented using a combination of software and hardware. They may include configuring an apparatus to carry out and/or support any or all of techniques described herein. Although at least some aspects of the examples described herein with reference to the drawings comprise computer processes performed in processing systems or processors, examples described herein also extend to computer programs, for example computer programs on or in a carrier, adapted for putting the examples into practice. The carrier may be any entity or device capable of carrying the program. The carrier may comprise a computer readable storage media. Examples of tangible computer-readable storage media include, but are not limited to, an optical medium (e.g., CD-ROM, DVD-ROM or Blu-ray), flash memory card, floppy or hard disk or any other medium capable of storing computer-readable instructions such as firmware or microcode in at least one ROM or RAM or Programmable ROM (PROM) chips.

Where in the foregoing description, integers or elements are mentioned which have known, obvious or foreseeable equivalents, then such equivalents are herein incorporated as if individually set forth. Reference should be made to the claims for determining the true scope of the present disclosure, which should be construed so as to encompass any such equivalents. It will also be appreciated by the reader that integers or features of the disclosure that are described as preferable, advantageous, convenient or the like are optional and do not limit the scope of the independent claims. Moreover, it is to be understood that such optional integers or features, whilst of possible benefit in some embodiments of the disclosure, may not be desirable, and may therefore be absent, in other embodiments.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. A method of soft-decision decoding, the method comprising:

training a machine learning agent with communication signal training data;

providing to the trained machine learning agent a signal that has been received via a communications channel;

operating the machine learning agent to determine respective probabilities that the received signal corresponds to each of a plurality of symbols; and based on the determined respective probabilities, performing soft decision decoding on the received signal, wherein operating the machine learning agent comprises determining a normalized probability pair for each symbol bit, a normalized probability pair comprising a first probability that a respective symbol bit is a zero and a second probability that the respective symbol bit is a one, and wherein the first probability and the second probability of the normalized probability pair sum to 1.

2. The method according to claim 1, comprising generating the training data by applying a noise function to a set of known symbols.

3. The method according to claim 2, wherein a magnitude of the applied noise function is varied across the training data.

4. The method according to claim 3, wherein varying the magnitude of the applied noise function comprises varying a signal to noise ratio between 0 dB and 9 dB.

5. The method according to claim 2, wherein a magnitude of the applied noise function is varied between each symbol of the training data.

6. The method according to claim 1, wherein the training data comprises one or more pilot signals.

7. The method according to claim 1, wherein the training data comprises one or more previously transmitted communications signals.

8. The method according to claim 7, wherein the previously transmitted communications signals were transmitted via the communications channel.

9. The method according claim 1, comprising, subsequent to the performing, further training the machine learning agent with further communication signal training data.

10. The method according to claim 9, wherein the further communication signal training data comprises one or more pilot signals.

11. The method according to claim 9, wherein the further training is performed periodically.

12. The method according to claim 1, comprising determining one or more signal characteristics for each of the plurality of symbols, wherein the operating is carried out based on the determined signal characteristics.

13. The method according to claim 12, wherein the one or more signal characteristics comprise received power values for each of the plurality of symbols.

14. The method according to claim 13, comprising performing a Fourier transform on the received signal to determine the received power values.

15. The method according to claim 12, wherein the one or more signal characteristics comprise correlation values for each of the plurality of symbols.

16. The method according to claim 12, comprising:

converting the one or more signal characteristics into a vector; and providing the vector to the machine learning agent as an input.

17. The method according to claim 1, wherein the received signal comprises a frequency shift keying modulated signal.

18. An apparatus for use in soft-decision decoding, the apparatus being configured to:

train a machine learning agent with communication signal training data;

provide to the trained machine learning agent a signal that has been received via a communications channel;

operate the machine learning agent to determine respective probabilities that the received signal corresponds to each of a plurality of symbols; and based on the determined respective probabilities, perform soft decision decoding on the received signal, wherein operating the machine learning agent comprises determining a normalized probability pair for each symbol bit, a normalized probability pair comprising a first probability that a respective symbol bit is a zero and a second probability that the respective symbol bit is a one, and wherein the first probability and the second probability of the normalized probability pair sum to 1.

19. A non-transitory computer-readable storage media comprising a set of instructions which, when executed by a computerized device, cause the computerized device to perform a method of soft-decision decoding, the method comprising:

training a machine learning agent with communication signal training data;

providing to the trained machine learning agent a signal that has been received via a communications channel;

operating the machine learning agent to determine respective probabilities that the received signal corresponds to each of a plurality of symbols; and based on the determined respective probabilities, performing soft decision decoding on the received signal, wherein operating the machine learning agent comprises determining a normalized probability pair for each symbol bit, a normalized probability pair comprising a first probability that a respective symbol bit is a zero and a second probability that the respective symbol bit is a one, and wherein the first probability and the second probability of the normalized probability pair sum to 1.

* * * * *